United States Patent
Long

(10) Patent No.: US 7,177,771 B2
(45) Date of Patent: Feb. 13, 2007

(54) DIGITAL DYNAMIC FILTERING AND BEAT FREQUENCY REDUCTION FOR POWER MONITORING

(75) Inventor: Avery Long, Madison, AL (US)

(73) Assignee: Square D Company, Palatine, IL (US)

( * ) Notice: Subject to any disclaimer, the term of this patent is extended or adjusted under 35 U.S.C. 154(b) by 61 days.

(21) Appl. No.: 11/091,289

(22) Filed: Mar. 28, 2005

(65) Prior Publication Data

US 2006/0217907 A1    Sep. 28, 2006

(51) Int. Cl.
   *G01R 21/00* (2006.01)
(52) U.S. Cl. ............... 702/61; 702/60; 702/75; 702/79; 702/190; 324/76.44
(58) Field of Classification Search ............ 702/60–62, 702/57, 75, 76, 79, 124–126, 178, 189, 190, 702/197, 198
   See application file for complete search history.

(56) References Cited

U.S. PATENT DOCUMENTS 4,642,563 A * 2/1987 McEachern et al. ........ 324/111

2004/0181718 A1 * 9/2004 Long .................. 714/724
2005/0055586 A1 * 3/2005 Flen et al. ............ 713/300

OTHER PUBLICATIONS

Dallas Semiconductor Maxim DS1077L, 3V EconOscillator/Divider, 20 pages, no date.
Maxim 5th-Order, Lowpass, Switched-Capacitor Filters, MAX7418-MAX7425, 14 pages, Maxim Integrated Products, Sunnyvale, California, no date.
Burr-Brown Products from Instruments, ADS8364, 250kHz, 16-Bit, 6-Channel Simultaneous Sampling Analog-to-Digital Converters, 23 pages, Texas Instruments, Dallas, Texas, no date.

* cited by examiner

*Primary Examiner*—Hal Wachsman

(57) ABSTRACT

A power metering apparatus meters a power signal in a powered system. A low-pass filter receives the power signal and outputs a filtered signal. The filter implements a corner frequency programmable based on a first clocking signal and anti-aliases high frequency components of the power signal. An A/D converter receives the filtered signal and outputs a digital signal. The A/D converter samples the filtered signal according to a system clock based on a second clocking signal. A clocking element generates and outputs each of the first clocking signal and the second clocking signal. The first clocking signal is synchronous with the second clocking signal.

20 Claims, 4 Drawing Sheets

DIGITAL DYNAMIC FILTERING AND BEAT FREQUENCY REDUCTION FOR POWER MONITORING

FIELD OF THE INVENTION

The present invention relates generally to power monitoring systems and more specifically, to a system and method for implementing digital dynamic filtering and beat frequency reduction for power monitoring.

BACKGROUND OF THE INVENTION

Power monitoring systems monitor the flow of electric power in circuits through a plant or other facility. In the POWERLOGIC® system manufactured by Square D Corporation, circuit monitors and power meters are dedicated to power monitoring, while other compatible devices collect additional equipment information from protective relays, circuit breakers, transformer temperature controllers, and panelboards. Electrical data, such as current, power, energy, waveforms, and equipment status, is passed over a data network to one or more personal computers. The personal computers run power monitoring application software that retrieves, stores, organizes, and displays real-time circuit information in simple, usable formats. The information collected and stored in a power monitoring system helps operate a facility more efficiently. The quality of the data depends upon the accuracy of the instrumentation and the usability of the display formats.

The power meter can replace conventional metering devices such as ammeters, voltmeters, and watt-hour meters while providing other capabilities not offered by analog metering. The power meter's true rms readings reflect non-linear circuit loading more than conventional analog metering devices. The power meter can perform residual measurements such as calculating the neutral current even when the user does not provide a neutral current transformer. The power meter assists in identifying overloaded neutrals due to either unbalanced single phase loads or triplen harmonics. Circuits can be closely monitored for available capacity by keeping track of the peak average demand current.

Power quality standards for industrial power meters and circuit monitors require anti-aliasing circuitry for data integrity. The specifications in these standards are very concise. For example, power quality standards such as IEC 61000-4-7 $2^{nd}$ edition require that power signals be anti-aliased at least 50 dB at the Nyquist frequency. However, with fundamental frequencies that vary depending on the geographic region from 45 to 66 Hz, it is very difficult to design a filter that can be easily and quickly reconfigured especially when harmonic content up to the $50^{th}$ or above is of concern.

There are solutions to this problem such as, e.g., utilizing a switched capacitive filter coupled to an analog-to-digital filter. However, there is a fundamental problem with using switched capacitive filters. Specifically, if the clock signal driving the filter is not synchronous with an analog-to-digital (A/D) converter's master clock, coupled thereto, a beat frequency between the two asynchronous clocks will result and cause a measurement error in the signal. This error results from the internal sample and holds of the A/D converter latching the signal while the switched capacitive filter is changing it. The A/D converter's internal sample and holds are synchronous with its master clock. This would also result if one used external sample and holds with their analog to digital converter and the clocks were not synchronous.

Previous designs suffer from defects. For example, prior systems that utilize continuous time filters have fixed corner frequencies. Accordingly, the harmonic accuracies of such designs vary based upon the fundamental frequency of the detected signal. Also, such devices use only a pre-selected bandwidth for performing the monitoring, thereby preventing the devices from detecting certain high harmonics of the fundamental (e.g., harmonics above the $100^{th}$ order). The present invention is directed to satisfying this and other needs.

SUMMARY OF THE INVENTION

One embodiment of the invention is directed to a power metering apparatus to meter a power signal, such as current or voltage, in a powered system. A low-pass filter receives the power signal and outputs a filtered signal. The filter implements a corner frequency programmable based on a first clocking signal and anti-aliases undesirable high frequency components of the power signal. An A/D converter receives the filtered signal and outputs a digital signal. The A/D converter samples according to a system clock based on a second clocking signal. A clocking element generates and outputs each of the first clocking signal and the second clocking signal. The first clocking signal is synchronous with the second clocking signal.

Another embodiment of the invention is directed to a method of metering a power signal in a powered system. The power signal is received and filtered to generate a filtered signal. A programmable corner frequency is implemented based on a first clocking signal and the filtering anti-aliases high frequency components of the power signal. The filtered signal is digitized by an analog-to-digital converter to generate a digital signal. A system clock for the analog-to-digital converter is based on a second clocking signal. Each of the first clocking signal and the second clocking signal are generated by a clocking element and the first clocking signal is synchronous with the second clocking signal.

The above summary of embodiments of the invention is not intended to represent each embodiment or every aspect of the present invention. The detailed description and Figures will describe many of the embodiments and aspects of the present invention.

BRIEF DESCRIPTION OF THE DRAWINGS

The foregoing and other advantages of the invention will become apparent upon reading the following detailed description and upon reference to the drawings.

Figure 1:
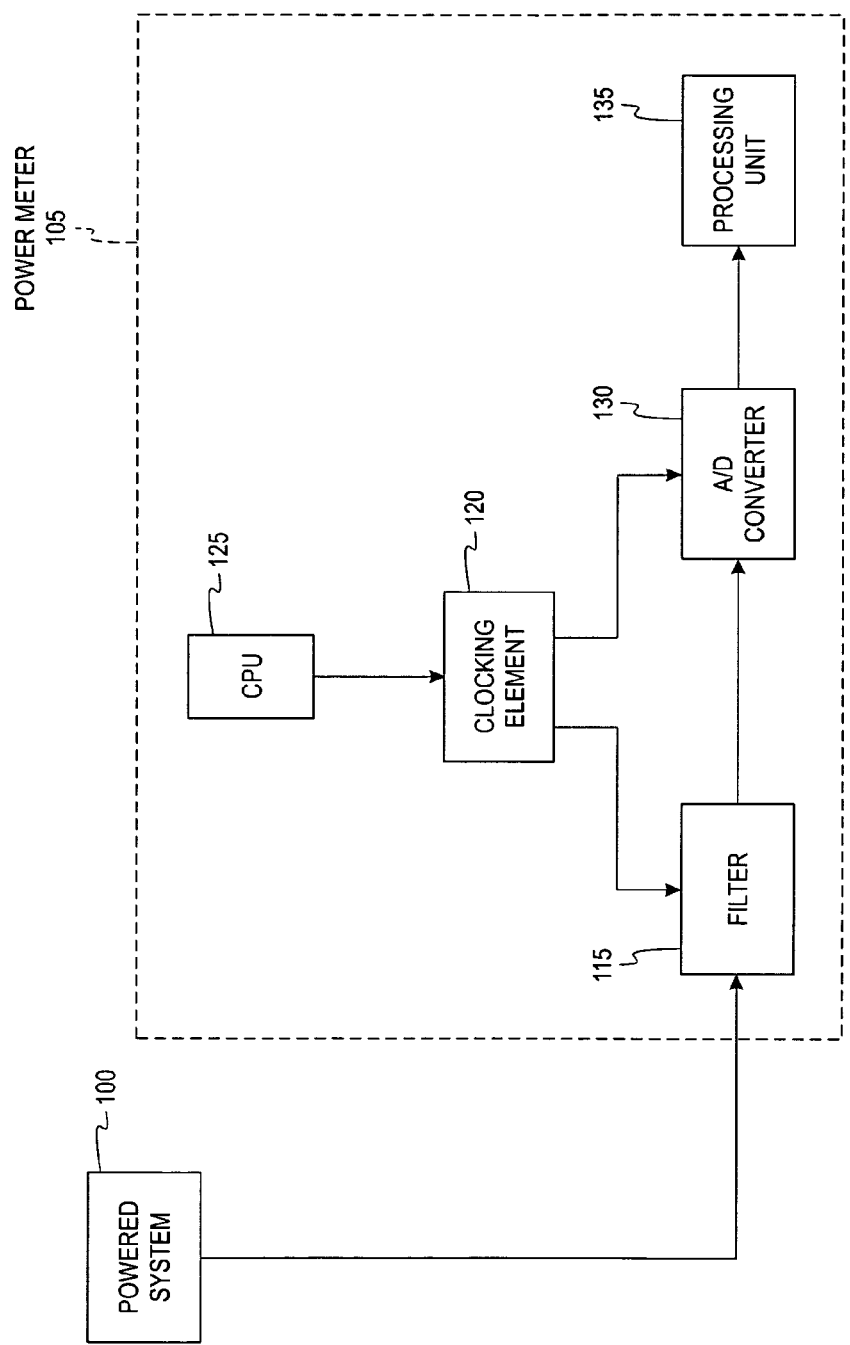
FIG. 1 illustrates a power monitoring system according to an embodiment of the invention.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

FIG. 1 illustrates a power monitoring system according to an embodiment of the invention. A powered system 100 is monitored to determine the quality and stability of the electrical power flowing through it. For example, a semiconductor fabrication lab typically requires high-quality power, as spikes in power can cause much damage to the products being fabricated. The powered system 100 is in communication with a power meter 105. The power meter 105 may be a power meter in the Power Logic family of power meters manufactured by Square D Company, headquartered located in Palatine, Ill. The power meter 105 measures various power signals. A technician may couple the power meter 105 to power lines on a transformer, for example, to analyze the power quality within such power lines. For example, the power meter 105 can analyze one or more phases of a power signal in a 3-phase A/C power system.

The power flowing within the powered system 100 has a fundamental frequency that is typically in a range of between 45 Hz to 66 Hz. The fundamental frequency varies depending upon the geographic region where the powered system 100 is located. There are typically a number of different harmonics of the fundamental frequency flowing through the powered system 100. It is important to detect these harmonics when monitoring power quality because they can damage equipment that is powered by the powered system 100. For example, sometimes harmonic content up to the $50^{th}$ order is of concern—if the fundamental frequency is 60 Hz, then the harmonic content up to the $50^{th}$ order has a frequency content up to 3 kHz. In addition to the fundamental frequency and the various harmonics thereof, the power signal also has various other frequencies that are not of concern (e.g., high frequency noise). Accordingly, to properly analyze the detected power signal, the frequencies other than the fundamental or harmonics need to be minimized.

This is accomplished by filtering the signal via filter 115. Filter 115 is a low-pass filter and is designed to filter out the frequencies that are not related to the fundamental frequency or harmonics. Filter 115 may be a switched capacitive filter such as one of the MAX7418–7425 series of $5^{th}$-order, lowpass, switched-capacitive filters manufactured by Maxim Integrated Products. The filter 115 has a corner frequency which can be set to ensure that the frequencies not of concern in the power signal are filtered out. Because the fundamental frequencies of the power system being measured often vary between 45 and 66 Hz, it is important that the corner frequency is set precisely. Otherwise, if the corner frequency is set at the wrong point, the harmonics can be distorted. If the fundamental frequency of the powered system is 45 Hz, then the required corner frequency is different than it would be if the fundamental frequency were 66 Hz. For example, because the $50^{th}$ order harmonic of a 45 Hz fundamental frequency signal is 2.25 kHz, and the $50^{th}$ order harmonic of a 66 Hz fundamental frequency signal is 3.30 kHz, a higher corner frequency is needed when the power signal has a fundamental frequency of 66 Hz. If the filter 115 is not synchronous to a master clock of an analog-to-digital (A/D) converter 130 coupled thereto, converter clock beat frequencies often arise in the filtered signal because the system clocks of the filter 115 and the A/D converter 130 are not synchronous. Beat frequencies occur when two signals of different frequency combine, causing alternating constructive and destructive interference.

The corner frequency of the filter 115 is set based on an input clocking signal from clocking element/device 120. The clocking element 120 is controlled by a CPU 125. More specifically, the CPU 125 sets a master clocking signal, $f_{CLK}$, of the clocking element 120. The corner frequency may have a linear relation to the frequency of $f_{CLK}$. For example, the corner frequency may be set at $\frac{1}{100}$ of $f_{CLK}$. Accordingly, by varying $f_{CLK}$, the corner frequency can be varied. The clocking element 120 may be a 3 V EconOscillator/Divider DS 1077L integrated circuit manufactured by Dallas Semiconductor.

Because the IEC 61000-4-7 $2^{nd}$ edition standard ("the IEC standard") requires that power signals be anti-aliased at least 50 dB at the Nyquist frequency, the corner frequency must be set at an appropriate frequency to ensure proper antialiasing of the power signal at the Nyquist frequency. The corner frequency is defined operationally as the frequency at which the magnitude of the gain of the signal out of the filter 115 is −3 dB.

The filtered analog signal output from the filter 115 is received by the A/D converter 130 which digitizes the filtered analog signal. As discussed above, to minimize the possibility of beat frequencies, the clocking signal of the A/D converter 130 is synchronized with the clocking signal of the filter 115. This is accomplished by use of the clocking element 120, which provides both of the clocking signals for the filter 115 and the A/D converter 130, as discussed below with respect to FIG. 2. After the filtered analog signal has been digitized by the A/D converter 130, it is output to a processing unit 135, which performs analysis on the digital filtered signal. The A/D converter 130 may be a 250 kHz, 16-bit, 6-channel analog-to-digital converter such as the ADS8364 integrated circuit manufactured by Burr-Brown Products.

Since the corner frequency and the frequency of the A/D converter 130 are both ultimately controlled by the CPU 125, a user of this system can quickly alter the corner frequency while maintaining synchronicity with the A/D converter 130. Accordingly, the system provides a fully digital filtered signal with a programmable corner frequency that can be set on-the-fly.

Figure 2:
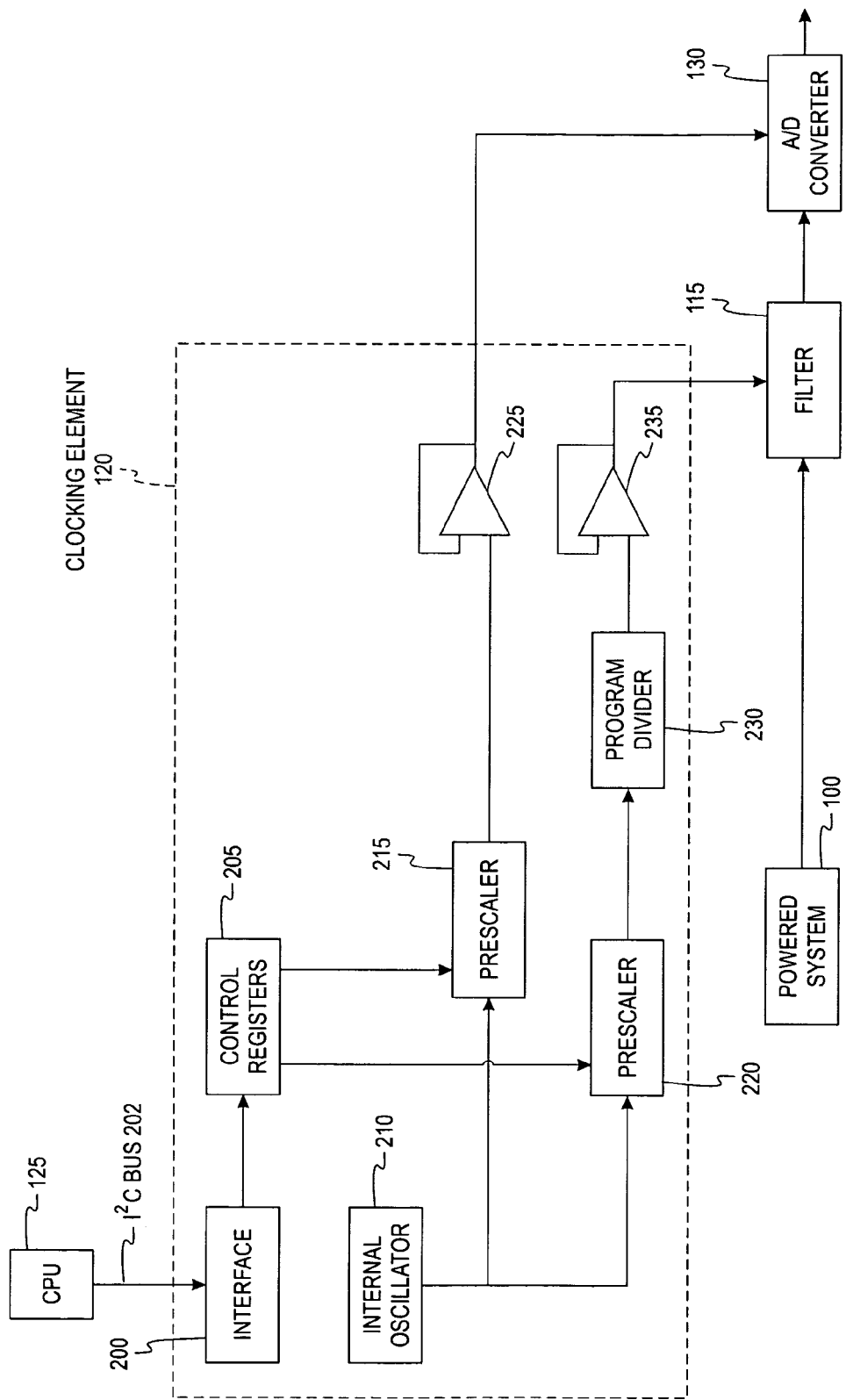
FIG. 2 illustrates an expanded view of a clocking element in communication with a CPU, a filter, and an A/D converter according to an embodiment of the invention.

FIG. 2 illustrates an expanded view of the clocking element 120 in communication with the CPU 125, the filter 115, and the A/D converter 130 according to an embodiment of the invention. As shown, the CPU 125 communicates with an interface 200 of the clocking element 120. The communication link between the CPU 125 and the interface 200 may be an I²C bus 202, a 2-way interface, and the CPU 125 may transmit serial data and a serial clocking signal over the I²C bus 202. The interface 200 is in communication with control registers 205. The clocking element 120 has an internal oscillator 210. The internal oscillator 210 may generate the master clocking signal, $f_{CLK}$. The frequency of $f_{CLK}$ may be, e.g., 40 MHz, 50 MHz, 60 MHz, or 66.66 MHz. As shown, $f_{CLK}$ is transmitted from the internal oscillator 210 separately to prescaler 215 and prescaler 220. Prescalers 215 and 220 are utilized to divide the frequency of the $f_{CLK}$ by a factor such as 1, 2, 4, or 8. The output of prescaler 215 is sent to op-amp 225 and then over to the A/D converter 130. This output is $f_{CLK1}$, the clocking signal for the A/D converter 130.

Prescaler 220 also receives $f_{CLK}$ and outputs its own divided clocking signal to the programmable divider 230. The programmable divider 230 divides the output of prescaler 220 by any number selected between a range of numbers, such as 2 to 1025. The output of programmable divider 230 is sent to op-amp 235 and then over to filter 115.

The output of the programmable divider 230 is $f_{CLK2}$, the clocking signal for the filter 115. As stated above, the corner frequency of the filter 115 is a function of its clocking signal, $f_{CLK2}$. In some embodiments, op-amps 225 and 235 are not required.

As illustrated, the control registers 205 are coupled to prescaler 215, prescaler 220, and programmable divider 230 and set the various divider factors of these elements. The CPU 125 provides the values for the control registers 205 via the I²C bus 202 and the interface 200, and therefore sets these divider factors and ultimately $f_{CLK1}$ and $f_{CLK2}$. Therefore, the CPU 125 digitally sets the clocking signals $f_{CLK2}$ and $f_{CLK1}$ for filter 115 and A/D converter 130, respectively, allowing the corner frequency to be precisely set while ensuring that clocking signals $f_{CLK2}$ and $f_{CLK1}$ are synchronized. These clocking signals are synchronized because they are both derived from the $f_{CLK}$ signal generated by internal oscillator 210.

Figure 3:
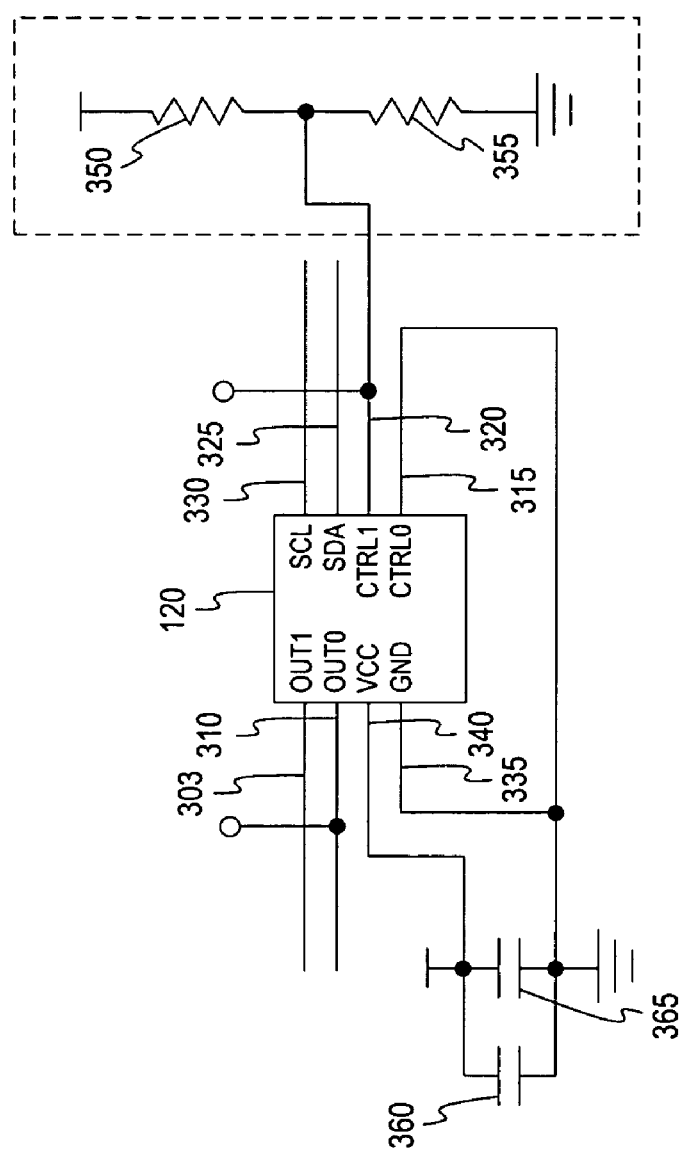
FIG. 3 illustrates a schematic view of the clocking element of FIGS. 1 and 2.

FIG. 3 illustrates a schematic view of the clocking element 120 of FIGS. 1 and 2. As shown, the clocking element 120 is an integrated circuit. The clocking element 120 may be a dual-output, programmable, fixed-frequency oscillator requiring no external components for operation. It can be used as a processor-controlled frequency synthesizer or as a stand-alone oscillator. The two synchronous output operating frequencies are user-adjustable in submultiples of the master clocking signal $f_{CLK}$ through use of the two on-chip programmable prescalars 215 and 220 and the divider 230. The specific output frequencies chosen are stored in the control registers 205, which may be a nonvolatile (e.g., EEPROM) memory.

The clocking element 120 features a 2-wire serial interface (e.g., over an I²C bus 202) that allows in-circuit on-the-fly programming of programmable prescalers 215 and 220 and divider 230 with the desired values being stored in the control registers 205. Design changes can be accommodated in-circuit, on-the-fly by programming different values into the clocking element 120.

As shown, the clocking element 120 has a number of pins. OUT1 303 is the main oscillator output pin. Its frequency is determined by control register settings for the prescaler 220 and the programmable divider 230 in the clocking element 120. The output of OUT1 303 corresponds to clocking signal $f_{CLK2}$ of FIG. 2. OUT0 310 is a reference output. Its frequency is determined by the control register 205 settings for a second prescalar 215. The output of OUT2 310 corresponds to clocking signal $f_{CLK1}$ of FIG. 2. CTRL0 315 is a multi-functional input pin that can be selected as a multiplexer select, output enable, and/or a power-down. User-programmable control register 205 values determine its function.

CTRL1 320 is another multi-functional input pin that can be selected as an output enable and/or a power-down. Its function is determined by the user-programmable control register value of control registers in the clocking integrated circuit 300. SDA 325 is an input/output pin for the 2-wire serial interface (e.g., the I²C bus 202) used for data transfer. SCL 330 is an input pin for the 2-wire serial interface (e.g., the I²C bus 202) used to synchronize data movement on the serial interface. $V_{cc}$ 335 is the power-supply voltage and GND 340 is the ground reference.

As shown, CTRL1 320 is coupled to a voltage divider having resistors 350 and 355 which sets the value of CTRL1 320. CTRL0 315 is coupled to GND 340. $V_{cc}$ 335 is set at 3.3 volts. Capacitors 360 and 365 are coupled between $V_{cc}$ 335 and GND 340. SCL 330 and SDA 325 are the pins coupled to the CPU 125 of FIG. 1.

There are different modes of operation of the power meter 105. For example, in one mode, the power metering may be performed in accordance with the IEC standard. If 512 points are metered per second, in accordance the IEC standard at 60 Hz, the power meter 105 would set its corner frequency at 4320 Hz to ensure 50 dB of anti-aliasing at the Nyquist frequency, which in this case would be 15.3 kHz (i.e., the frequency of the $255^{th}$ harmonic of a power signal having a 60 Hz fundamental frequency). However, if the fundamental frequency were 50 Hz, then the Nyquist frequency would be 12.75 kHz. Accordingly, to ensure the proper anti-aliasing of the power signal at the Nyquist frequency, the corner frequency must be set precisely, as discussed above. Otherwise, the power meter 105 may not be within the IEC specification of 50 dB of anti-aliasing at the Nyquist frequency.

Figure 4:
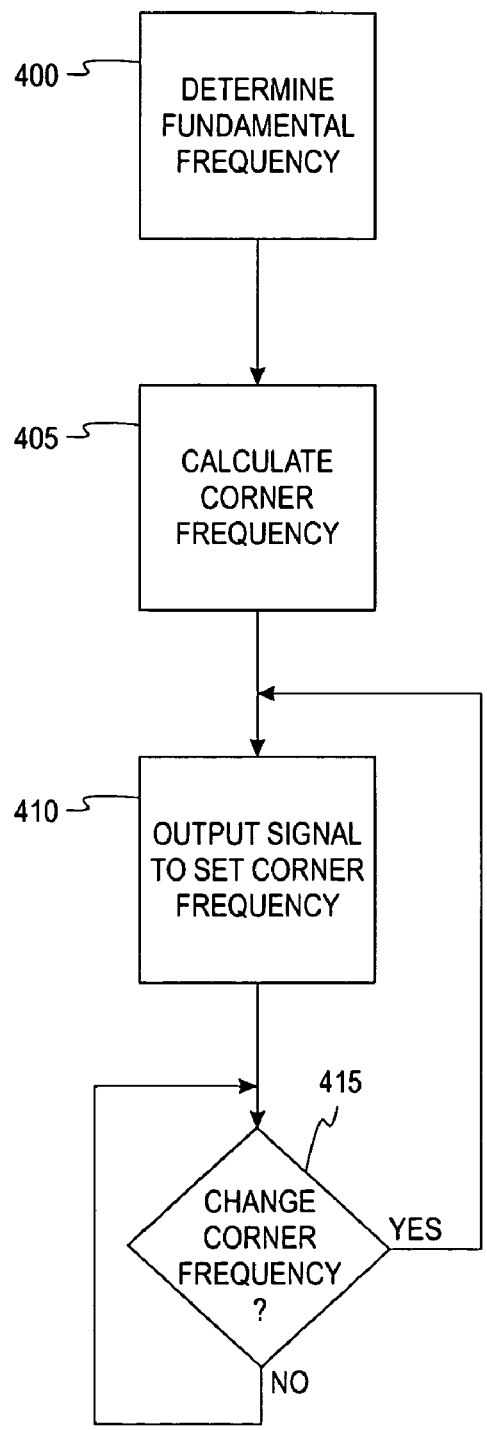
FIG. 4 illustrates a method of operation of a power meter according to an embodiment of the invention.

FIG. 4 illustrates a method of operation of the power meter 105 according to an embodiment of the invention. First, at step 400, the fundamental frequency of the metered signal is determined. The CPU 125 may measure the fundamental frequency. Alternatively, a user may hook up the power signal to an oscilloscope and manually measure the fundamental frequency and then provide an input of the frequency to the CPU 125. For example, the user may type in the fundamental frequency on a keypad in communication with the CPU 125. Next, at step 405, the CPU 125 calculates the necessary corner frequency required to ensure 50 dB of anti-aliasing at the Nyquist frequency. Alternatively, the user may manually calculate and enter a desired corner frequency. By manually calculating and entering the corner frequency, the user can operate the power meter 105 in manner not in accordance with the IEC standard. In other words, the user can enter a larger corner frequency than what is required to ensure compliance with the IEC standard so that higher-order harmonics (e.g., up the $255^{th}$) may be analyzed. If the user were to set the corner frequency to a value above the Nyquist frequency, then the filtering would be virtually disabled and the power meter 105 would have harmonic response up to the $255^{th}$ harmonic.

Once the corner frequency is either calculated by the CPU 125 or is manually entered, the CPU 125 communicates with the clocking element 120 via the I²C bus 202 at step 410 to digitally set the corner frequency. In the event that the corner frequency is set to 1/100 of the master clocking frequency, $f_{CLK}$, of the clocking element 120, $f_{CLK}$ is set to an appropriate value. For example, if the corner frequency is desired to by 4.32 kHz, $f_{CLK}$, would be set to 432 kHz, a frequency 100 times as large as the desired corner frequency. The CPU 125 may alter the corner frequency at any time on-the-fly if either the fundamental frequency is determined to have changed or the user submits a different required corner frequency.

At step 415, processing returns to step 410 if the CPU 125 determines that the corner frequency needs to be changed. If it does not need to be changed, processing remains at step 415. The processing may determine that the corner frequency needs to be changed, e.g., by the user manually entering a different corner frequency via an input device (e.g., a keypad) in communication with the CPU 125. Alternatively, the processing may determine that the corner frequency needs to be changed by the CPU 125 detecting a different fundamental frequency.

Embodiments of the present invention allow a user to quickly and easily change the corner frequency of a digital filter. In some embodiments, the corner frequency of the filter 115 is programmable to minimize the anti-aliasing of the high frequency components of the power signal to provide a bandwidth of the power signal up to a folding frequency of the power signal.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A power metering apparatus to meter a power signal in a powered system, comprising:
    a low-pass filter to receive the power signal being metered by the power metering apparatus and output a filtered signal, wherein the low-pass filter implements a corner frequency programmable based on a first clocking signal and anti-aliases high frequency components of the power signal;
    an A/D converter to receive the filtered signal and output a digital signal, the A/D converter sampling the filtered signal according to a system clock based on a second clocking signal; and
    a clocking element to generate and output each of the first clocking signal and the second clocking signal, wherein the first clocking signal is synchronous with the second clocking signal.

2. The power metering apparatus of claim 1, wherein the power signal is an A/C signal.

3. The power metering apparatus of claim 1, wherein the clocking element generates a master clocking signal, and the first clocking signal has a first frequency that is a first programmable fraction of the master clocking signal, and the second clocking signal has a second frequency that is a second programmable fraction of the master clocking signal.

4. The power metering apparatus of claim 3, wherein the first programmable fraction and the second programmable fraction are set based on an output of a processor in communication with the clocking element.

5. The power metering apparatus of claim 4, wherein the processor is in communication with the clocking element via an I²C bus.

6. The power metering apparatus of claim 4, wherein the processor is in communication with an input device, and the corner frequency is set by the input device.

7. The power metering apparatus of claim 6, wherein the input device is a keypad.

8. The power metering apparatus of claim 4, wherein the processor sets the corner frequency based on a detected fundamental frequency of the analog power signal.

9. The power metering apparatus of claim 1, wherein the corner frequency is programmable to minimize the anti-aliasing of the high frequency components to provide a bandwidth of the power signal up to a folding frequency of the power signal.

10. The power metering apparatus of claim 1, wherein the low-pass filter anti-aliases the high frequency components of the power signal by at least 50 dB at a Nyquist frequency of the power signal.

11. A method of metering a power signal in a powered system, comprising:
    generating each of a first clocking signal and a second clocking signal wherein the first clocking signal is synchronous with the second clocking signal;
    receiving the power signal being metered in the powered system, filtering the power signal to generate a filtered signal, wherein a programmable corner frequency is implemented based on the first clocking signal and the filtering anti-aliases high frequency components of the power signal; and
    digitizing the filtered signal via an analog-to-digital converter to generate a digital signal, a system clock of the analog-to-digital converter being based on the second clocking signal.

12. The method of claim 11, wherein the power signal is an A/C signal.

13. The method of claim 11, wherein the first clocking signal has a first frequency that is a first programmable fraction of a master clocking signal, and the second clocking signal has a second frequency that is a second programmable fraction of the master clocking signal.

14. The method of claim 13, wherein the generating is carried out by at least a clocking element and wherein a first programmable fraction and the second programmable fraction are set based on an output of a processor in communication with the clocking element.

15. The method of claim 14, wherein the output of the processor is received via an I²C bus.

16. The method of claim 14, wherein the processor is in communication with an input device, and the corner frequency is set by the input device.

17. The method of claim 16, wherein the input device is a keypad.

18. The method of claim 14, wherein the processor sets the corner frequency based on a detected fundamental frequency of the power signal.

19. The method of claim 11, wherein the corner frequency is programmable to minimize the anti-aliasing of the high frequency components to provide a bandwidth of the power signal up to a folding frequency of the power signal.

20. The method of claim 11, the high frequency components of the power signal are anti-aliased by at least 50 dB at a Nyquist frequency of the power signal.

* * * * *